(12) United States Patent
Matsuyuki et al.

(10) Patent No.: US 10,335,979 B2
(45) Date of Patent: Jul. 2, 2019

(54) MACHINING FEATURES IN A CERAMIC COMPONENT FOR USE IN AN ELECTRONIC DEVICE

(71) Applicant: Apple Inc., Cupertino, CA (US)

(72) Inventors: Naoto Matsuyuki, Tokyo-to (JP); Adam T. Clavelle, Cupertino, CA (US); Inori Iwata, Tokyo-to (JP); David I. Nazzaro, Groveland, MA (US)

(73) Assignee: APPLE INC., Cupertino, CA (US)

( * ) Notice: Subject to any disclaimer, the term of this patent is extended or adjusted under 35 U.S.C. 154(b) by 497 days.

(21) Appl. No.: 14/868,560

(22) Filed: Sep. 29, 2015

(65) Prior Publication Data

US 2016/0089811 A1    Mar. 31, 2016

Related U.S. Application Data

(60) Provisional application No. 62/057,859, filed on Sep. 30, 2014.

(51) Int. Cl.
| | | |
|---|---|---|
| *B28B 1/14* | (2006.01) | |
| *B28B 1/24* | (2006.01) | |
| *B28B 1/48* | (2006.01) | |
| *C04B 35/48* | (2006.01) | |
| *B28B 11/24* | (2006.01) | |
| *B28B 11/12* | (2006.01) | |

(Continued)

(52) U.S. Cl.
CPC ............... *B28B 11/24* (2013.01); *B28B 1/48* (2013.01); *B28B 11/0863* (2013.01); *B28B 11/12* (2013.01); *B28D 1/14* (2013.01); *C04B 35/48* (2013.01); *H05K 5/0004* (2013.01); *B28B 1/14* (2013.01); *B28B 1/24* (2013.01); *H04M 1/026* (2013.01)

(58) Field of Classification Search
CPC ............ C04B 35/48; C04B 2235/6022; C04B 2235/6027; B28B 1/14; B28B 1/24; B28B 1/265
See application file for complete search history.

(56) References Cited

U.S. PATENT DOCUMENTS

| | | |
|---|---|---|
| 1,675,910 A | 7/1928 | Riker |
| 2,210,094 A | 8/1940 | Mueller |

(Continued)

FOREIGN PATENT DOCUMENTS

| | | |
|---|---|---|
| CN | 201022205 | 2/2008 |
| CN | 201248054 | 5/2009 |

(Continued)

OTHER PUBLICATIONS

Author Unknown, "Laboratory Instruments," http://www.mocon.com, 2 pages, at least as early as Oct. 12, 2012.

(Continued)

*Primary Examiner* — Erin Snelting
(74) *Attorney, Agent, or Firm* — Dorsey & Whitney LLP

(57) ABSTRACT

A ceramic part and methods for making the ceramic part are disclosed. A green body or non-sintered part may be formed using a casting or molding process. The green body may not be sintered or may be partially sintered before machining one or more features into a surface of the green body. After machining, the component may be fully sintered to create a hardened ceramic component.

11 Claims, 5 Drawing Sheets

(51) Int. Cl.
*H05K 5/00* (2006.01)
*B28D 1/14* (2006.01)
*B28B 11/08* (2006.01)
*H04M 1/02* (2006.01)

(56) References Cited

U.S. PATENT DOCUMENTS

| | | |
|---|---|---|
| 2,420,989 A | 5/1947 | Waldron |
| 2,728,929 A | 1/1956 | Bell |
| 2,859,510 A | 11/1958 | Baxa |
| 2,909,281 A | 10/1959 | Koskinen |
| 3,012,384 A | 12/1961 | Brown et al. |
| 3,123,910 A | 3/1964 | Neilson |
| 3,202,561 A | 8/1965 | Swanson et al. |
| 3,290,832 A | 12/1966 | Highberg et al. |
| 3,346,904 A | 10/1967 | Armstrong |
| 3,696,563 A | 10/1972 | Rands |
| 4,038,783 A | 8/1977 | Rosenthal |
| 4,111,029 A | 9/1978 | Dulaquais |
| 4,164,704 A | 8/1979 | Kato et al. |
| 4,232,928 A | 11/1980 | Wickersham |
| 4,445,300 A | 5/1984 | Sekiya et al. |
| 4,552,800 A | 11/1985 | Blasch et al. |
| 4,584,799 A | 4/1986 | Juvet |
| 4,594,814 A | 6/1986 | Olszewski et al. |
| 4,753,918 A | 6/1988 | Cyron |
| 4,911,796 A | 3/1990 | Reed |
| 4,945,687 A | 8/1990 | Scheider et al. |
| 5,021,213 A * | 6/1991 | Nishio ............ B22F 3/1021 |
| | | 264/125 |
| 5,028,075 A | 7/1991 | Donnelly |
| 5,083,401 A | 1/1992 | Yamashita et al. |
| 5,144,536 A | 9/1992 | Tsukada et al. |
| 5,217,335 A | 6/1993 | Houchens, Jr. et al. |
| 5,276,999 A | 1/1994 | Bando |
| 5,280,819 A | 1/1994 | Newkirk et al. |
| 5,329,735 A | 7/1994 | Charlton et al. |
| 5,353,463 A | 10/1994 | Bracy, Jr. |
| 5,590,387 A * | 12/1996 | Schmidt ............ B22F 1/0014 |
| | | 419/36 |
| 5,720,649 A | 2/1998 | Gerber et al. |
| 5,779,218 A | 7/1998 | Kowanz |
| 5,843,117 A | 12/1998 | Alt et al. |
| 5,953,989 A | 9/1999 | Uchiyama et al. |
| 6,087,191 A | 7/2000 | Boggs |
| 6,110,015 A | 8/2000 | Christianson et al. |
| 6,149,506 A | 11/2000 | Duescher |
| 6,183,347 B1 | 2/2001 | Shaw |
| 6,276,994 B1 | 8/2001 | Yoshida et al. |
| 6,406,769 B1 | 6/2002 | Delabre |
| 6,413,895 B1 * | 7/2002 | Merkel ............ B01D 39/2068 |
| | | 264/177.12 |
| 6,453,783 B2 | 9/2002 | Yu et al. |
| 6,464,080 B1 | 10/2002 | Morris et al. |
| 6,517,995 B1 | 2/2003 | Jacobson et al. |
| 6,717,738 B2 | 4/2004 | Yamada et al. |
| 6,811,136 B2 | 11/2004 | Eberhardt et al. |
| 7,122,057 B2 | 10/2006 | Beam et al. |
| 7,171,838 B2 | 2/2007 | Shiokawa |
| 7,540,697 B2 | 6/2009 | Wang et al. |
| 7,582,175 B2 | 9/2009 | Trejo-Rincon |
| 7,597,483 B2 | 10/2009 | Simmons et al. |
| 7,685,676 B2 | 3/2010 | McClellan |
| 7,774,918 B2 | 8/2010 | Ainsworth |
| 8,015,852 B2 | 9/2011 | Su |
| 8,052,743 B2 | 11/2011 | Weber et al. |
| 8,066,251 B2 | 11/2011 | Brown |
| 8,157,936 B2 | 4/2012 | Tsuzuki et al. |
| 8,252,379 B2 | 8/2012 | Nagashima |
| 8,295,902 B2 | 10/2012 | Salahieh et al. |
| 8,439,947 B2 | 5/2013 | Howard et al. |
| 8,454,705 B2 | 6/2013 | Pressacco et al. |
| 8,460,060 B2 | 6/2013 | Wilson et al. |
| 8,530,847 B2 | 9/2013 | Frank et al. |
| 8,564,961 B2 | 10/2013 | Weber |
| 8,568,551 B2 | 10/2013 | Brennan et al. |
| 8,597,078 B2 | 12/2013 | Wilson et al. |
| 8,601,849 B2 | 12/2013 | Luo et al. |
| 8,703,040 B2 | 4/2014 | Liufi et al. |
| 8,733,422 B2 | 5/2014 | Browning et al. |
| 8,738,104 B2 | 5/2014 | Yeates |
| 8,994,608 B2 | 3/2015 | Russell-Clarke et al. |
| 9,132,510 B2 | 9/2015 | Russell-Clarke et al. |
| 9,221,289 B2 | 12/2015 | Prest et al. |
| 9,634,378 B2 | 4/2017 | Golko et al. |
| 9,750,322 B2 | 9/2017 | Nazzaro et al. |
| 2005/0064345 A1 | 3/2005 | Oyake |
| 2006/0008616 A1 | 1/2006 | Dean et al. |
| 2006/0097127 A1 | 5/2006 | Firth |
| 2006/0162849 A1 | 7/2006 | Han |
| 2006/0268528 A1 * | 11/2006 | Zadesky ............ H04M 1/0202 |
| | | 361/728 |
| 2007/0019395 A1 | 1/2007 | Yeh et al. |
| 2007/0039691 A1 | 2/2007 | Mroz |
| 2008/0206509 A1 | 8/2008 | Kent et al. |
| 2008/0257006 A1 | 10/2008 | Durney et al. |
| 2008/0312727 A1 | 12/2008 | Blank |
| 2009/0014118 A1 | 1/2009 | Ratcliffe |
| 2009/0043228 A1 | 2/2009 | Northrop et al. |
| 2010/0008030 A1 * | 1/2010 | Weber ............ C25D 11/16 |
| | | 361/679.02 |
| 2010/0285248 A1 | 11/2010 | Zhu et al. |
| 2011/0041553 A1 | 2/2011 | Xiong et al. |
| 2011/0156361 A1 | 6/2011 | Ghalambor et al. |
| 2011/0267773 A1 | 11/2011 | MacFarlane |
| 2012/0212890 A1 | 8/2012 | Hoshino et al. |
| 2013/0216740 A1 | 8/2013 | Russell-Clarke et al. |
| 2013/0251934 A1 | 9/2013 | Caracciolo et al. |
| 2013/0318766 A1 | 12/2013 | Kiple et al. |
| 2014/0076731 A1 | 3/2014 | Russell-Clarke et al. |
| 2014/0082926 A1 | 3/2014 | Tam et al. |
| 2014/0102162 A1 | 4/2014 | Morgenstern et al. |
| 2014/0106129 A1 | 4/2014 | Teshima et al. |
| 2014/0342900 A1 * | 11/2014 | Nahas ............ C04B 35/111 |
| | | 501/135 |
| 2015/0273524 A1 | 10/2015 | Ely et al. |
| 2015/0289395 A1 | 10/2015 | Van Asseldonk et al. |
| 2015/0374397 A1 | 12/2015 | Brannon |
| 2016/0090326 A1 | 3/2016 | Matsuyuki et al. |
| 2016/0256979 A1 | 9/2016 | Matsuyuki et al. |
| 2017/0060193 A1 | 3/2017 | Franklin et al. |
| 2017/0304032 A1 * | 10/2017 | Jung ............ A61C 13/0006 |

FOREIGN PATENT DOCUMENTS

| | | |
|---|---|---|
| CN | 101693629 | 4/2010 |
| CN | 101877951 | 11/2010 |
| CN | 201940834 | 8/2011 |
| CN | 102316179 | 1/2012 |
| CN | 102695966 | 9/2012 |
| CN | 202720538 | 2/2013 |
| CN | 202872871 | 4/2013 |
| CN | 203191877 | 9/2013 |
| CN | 203492064 | 3/2014 |
| CN | 103864452 | 6/2014 |
| CN | 103873619 | 6/2014 |
| CN | 103951420 | 7/2014 |
| JP | 60244493 | 12/1985 |
| JP | 200001745 | 2/2000 |
| KR | 1020080103031 | 11/2008 |
| WO | WO03/002289 | 1/2003 |
| WO | WO2012/007755 | 1/2012 |
| WO | WO2013/093822 | 6/2013 |

OTHER PUBLICATIONS

Author Unknown, "Stewmac Inlay Tools and Materials," http://web.archirve.org/...op/Inlay_pearl/Tools_and_supplies_for:_Inlay_pearl_cutting/Carbide_Downcut_Inlay_Router_Bits.html, 5 pages, at lease as early as Dec. 4, 2013.

* cited by examiner

MACHINING FEATURES IN A CERAMIC COMPONENT FOR USE IN AN ELECTRONIC DEVICE

CROSS-REFERENCE TO RELATED APPLICATION

This application is a nonprovisional patent application of and claims the benefit to U.S. Provisional Patent Application No. 62/057,859, filed Sep. 30, 2014 and titled "Ceramic Machining," the disclosure of which is hereby incorporated herein by reference in its entirety.

FIELD

Embodiments disclosed herein relate to ceramic parts for use in portable electronic devices. More particularly, embodiments relate to methods for machining ceramic parts before being completely sintered.

BACKGROUND

The use of ceramic materials in the manufacture of parts for portable electronic devices has increased as portable electronic devices become smaller and more durable. In general, there is a need for increased durability for components that form some electronic devices. It may be particularly advantageous to increase the durability while also maintaining or reducing the overall weight and size of the electronic device.

The relatively light weight of ceramic material in relation to its relatively high degree of hardness and scratch resistance weighs in favor of using ceramic parts for structural and/or protective components. Ceramics may also help the device meet consumers demands for aesthetically pleasing and refined surface finishes.

However, some components used in portable electronic devices include various sizes and complex shapes. Different methods and processes may be utilized to form ceramic materials into housings and other parts for portable electronic devices. However, due to their very hard and durable properties, ceramic parts may be difficult to form with fine or precise features, particularly using traditional machining techniques.

SUMMARY

In one embodiment, a green body, or non-sintered, ceramic material, is machined to produce a ceramic component for a portable electronic device. By utilizing a green body or partially sintered component, machining operations, including drilling holes, attachment features, ribs, bosses, and the like may be enhanced or improved. In particular, tool life may be improved or extended and the amount of time required to drill similar depth holes may be significantly reduced. Improvements to machining cycle time and machine down time may reduce the cost of the ceramic component.

Some example embodiments are directed to a method for manufacturing a ceramic component for a portable electronic device. A green body may be formed from a ceramic powder comprising zirconium dioxide. The green body may be machined to form a feature in a surface of the green body. The green body may be fully or completely sintered after machining to form the ceramic component. In some embodiments, machining the green body includes drilling a hole into the surface of the green body. The hole may have a diameter of less than 1 mm.

In some embodiments, forming the green body is performed using a gel-casting process. In some embodiments, forming the green body is performed using an injection-molding process. In some embodiments, forming the green body includes mixing a slurry including a solvent, water, and the ceramic powder and pouring the slurry into a casting mold. Pressure may be applied to the slurry while in the casting mold. The slurry may also be heated while in the casting mold to form the green body. The green body may be removed from the mold.

In some embodiments, heating the slurry includes heating it at a temperature sufficient to burn off or evaporate the water and solvent of the slurry. In some cases, heating the slurry results in partially sintering at least a portion of the green body. Heating the slurry may be performed at a temperature below 700 degrees Celsius. Heating the slurry may result in the green body having a hardness of less than 100 HV on the Vickers Hardness scale.

Some example embodiments are directed to a method for manufacturing a ceramic component. A green body may be formed from a zirconium dioxide material. The green body may be partially sintered to form a partially sintered component. The partially sintered component may be machined to form a feature in a surface of the partially sintered component. The partially sintered component may be fully sintered to form the ceramic component.

The partial sintering may be performed at a temperature ranging between 700 degrees Celsius and 1500 degrees Celsius. In some cases, partially sintering the green body results in the partially sintered component having a hardness of approximately 100 HV on the Vickers Hardness scale. In some cases, partially sintering includes heating the green body to a temperature of approximately 900 degrees Celsius for a duration ranging between 1 and 5 hours. Fully sintering the component may include heating the green body to a temperature of approximately 1500 degrees Celsius for a duration between 12 and 24 hours.

Forming the green body may be performed using one of: a gel casting process or an injection-molding process. In some embodiments, a slurry, including a solvent, water, and the zirconium dioxide material is mixed. The slurry may be injected into an injection mold and heated. The heating may perform or cause the partial sintering to form the partially sintered component.

Some example embodiments are directed to a ceramic component formed from a zirconium dioxide material and configured for assembly in a portable electronic device. The ceramic component may include a surface and a machined feature formed into the surface. The machined feature may be formed before the ceramic component has been fully sintered. In some cases, the machined feature is a hole having a diameter less than 1 mm. In some embodiments, the machined feature is one or more of: a mounting boss; an opening; a rib feature; a through hole; or a machined surface. In some cases, the ceramic component is configured to couple to a mating component to form a housing for the portable electronic device.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
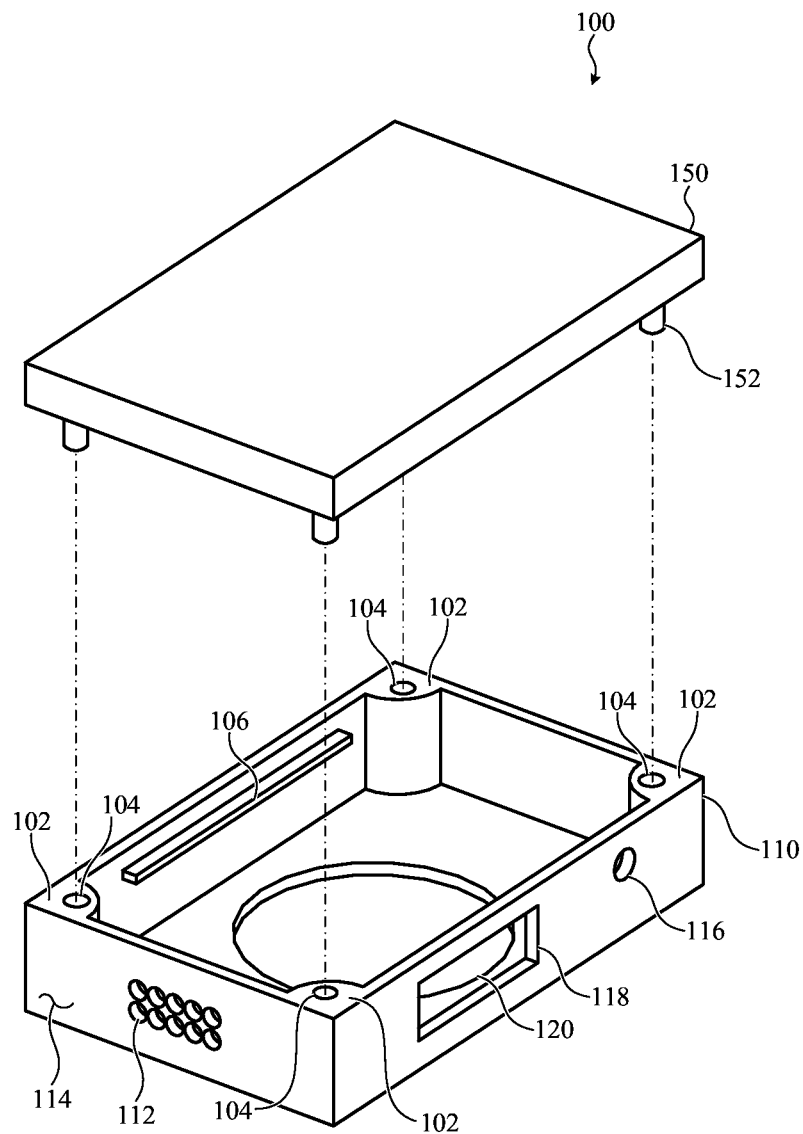
FIG. 1 depicts an example housing that includes a ceramic part having various features formed therein.

Reference will now be made in detail to representative embodiments illustrated in the accompanying drawings and in particular with reference to FIGS. 1-4. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims. Those skilled in the art will readily appreciate that the detailed description given herein with respect to these Figures is for explanatory purposes only and should not be construed as limiting. Like reference numerals denote like structure throughout each of the various figures.

Many parts for electronic devices may be made from a ceramic material. Housings, protective sheets, internal structural elements, buttons, switches, and display covers may all be made from various ceramic materials. The general shape and features of a ceramic part may be formed using a molding or casting process. However, it may be advantageous to form some features using a machining operation including, for example, milling, drilling, grinding, and the like. However, hard ceramic materials may be difficult to machine using traditional techniques. Due to the hardness of the ceramic materials, even moderate machining operations may result in excessive tool wear. Moreover, small or fine features may be difficult to machine into a ceramic part because the small tools that are required to form the small or fine features may lack sufficient strength and durability.

The embodiments described herein are directed to processes for machining ceramic components before the parts have been fully sintered. In particular, some embodiments are directed to machining features into an unsintered or green-body ceramic material that is typically much softer and easier to machine as compared to a fully sintered ceramic component. Some embodiments are directed to machining features into a partially sintered ceramic that has been stabilized by sintering some, but not all, of the ceramic material, which may result in a part that is more dimensionally and structurally stable than an unsintered or green body ceramic, but still softer as compared to a fully sintered ceramic component. Some example embodiments may be directed to a manufacturing process that uses a specific amount of partial sintering that is configured to balance the potential benefits of having a more stable material with an appropriate or acceptable level of hardness. In some cases, the manufacturing process is configured to produce a desired geometric shape and tolerance at a manufacturing time or cost that is acceptable.

In general, ceramic materials are inorganic, non-metallic materials made from metal, non-metal, and/or metalloid compounds. Ceramic materials may be crystalline, partly crystalline or, in some cases, amorphous. Ceramic materials tend to be strong, stiff, brittle, chemically inert, and non-conductors of heat and electricity, but their properties may vary widely. While some ceramic materials, such as porcelain, may be used as an electrical insulator, some ceramic compounds may have conductive properties and/or may be superconductors. Certain ceramics are used in various applications due to their relatively light weight, scratch resistance, durability and, in some cases, because ceramics may be formed with a surface that is smooth to the touch.

In some cases, ceramic materials may be formed from a transparent material, such as aluminum oxide (e.g., sapphire) or zirconium dioxide (e.g., zirconia). Transparent ceramic materials may be particularly suitable for use as protective covers for displays, cameras, or other optical components. Transparent ceramic materials may be particularly well suited for use on an exterior surface of a portable or wearable electronic device due to improved impact resistance and scratch resistance as compared to polycarbonate or some metal materials typically used to form a housing or protective cover of an electronic device.

Parts formed using certain ceramic materials, such as the aforementioned zirconium dioxide, may be formed a number of different ways. In some cases, the overall geometry of a part may be formed using a gel casting, injection molding, or other similar shaping technique. These processes typically rely on heat-sensitive plasticizers, such as polymers, to allow the material to flow into a mold or die that defines the shape of the part. The part is cooled and then removed from the die.

While gel casting and ceramic injection molding may be used to form a wide variety of part geometries, these processes may not produce a fine or polished surface finish. These processes may also not be able to reproduce fine or small features with the necessary dimensional precision or tolerance needed for the application. In some cases, fine or small features may be formed using a machining operation. However, because the hardness of some ceramic materials is as hard as, or harder than, most metals, machining using a metal tool can present significant challenges. Metal tooling used to machine some ceramic parts may tend to wear out rapidly, thereby requiring costly and time-consuming tooling replacement. Re-tooling slows down manufacturing and typically results in a more costly finished part.

Embodiments described herein are directed to manufacturing processes for forming a ceramic component by machining the ceramic component before it is fully sintered. In general, a manufacturing process may include forming a ceramic material block using a casting or molding operation to form a bulk part. After forming the bulk part but before being fully sintered, one or more features may be formed into the component using a machining operation. The machining operation may be performed on an unsintered or green-body or a partially sintered component.

In general, sintering may be directed to a process of forming a solid mass of material by applying heat and/or pressure, without completely melting the material to which the heat and/or pressure is applied. Before sintering, a ceramic powder or powdered ceramic may be mixed with a binder, solvent and/or water to form a slurry which may be further processed to form a partially stabilized part, which may be referred to as a "green body," "green-state material," or "bulk part."

In some cases, the green body may be heated at a low temperature to burn off or reduce the concentration of binder. The green body may be machined to form one or more features before being partially or fully sintered. A sintering operation may include a high-temperature firing step that is performed at a temperature below the melting point of the ceramic but at a high enough temperature to fuse or partially fuse the particles of the green body and to increase its density. The increased density may result in a component having improved strength and fracture toughness, which are the traits desired for ceramic parts used in a durable portable electronic device.

FIG. 1 depicts an example housing 100 that including a ceramic component 110 having various features formed therein. The housing 100 includes a ceramic component 110 and a mating component 150, which may be coupled together to form an enclosure for an electronic device. The electronic device may be a portable electronic device, such as a mobile telephone, a portable media player, a tablet computing system, a notebook computing system, or other similar device. The electronic device may also take the form of a wearable electronic device, such as a wrist-worn electronic device, health monitoring device, time-keeping device, or the like.

The ceramic component 110, and possibly the mating component 150, may be formed from a ceramic material, such as a zirconia ceramic, that is manufactured in accordance with the embodiments described herein. In particular, the ceramic component 110 may include one or more features that are formed by performing a machining operation before the ceramic component 110 is completely or fully sintered.

In some implementations, the ceramic component 110 and the mating component 150 of the housing 100 cooperate to form a protective enclosure for internal components of an electronic device. For example, the ceramic component 110 and the mating component 150 of the housing may provide a protective enclosure and/or structural support for internal components including, for example, one or more processing units, computer memory, speakers, microphones, circuitry, and other similar components. The mating component 150, which may be formed from a transparent ceramic material, may form a transparent cover or optical window for that provides protection for a visual element, such as a liquid crystal display (LCD), organic light emitting diode (OLED) display, or the like that is positioned within the housing 100.

The ceramic component 110 may include or incorporate various features that may be used to attach the component to the device or interface with other components. In particular, the ceramic component 110 includes one or more mounting features 102, which may also be referred to as mounting bosses, standoffs, protrusions, or other similar features. The mounting features 102 may be integrally formed into a sidewall of the ceramic component 110, as shown in FIG. 1, or, alternatively, may be free-standing and project from an interior surface of the ceramic component 110.

In this example, each mounting feature 102 includes a hole 104, which may be used to attach the ceramic component 110 to the mating component 150. The holes 104 may be configured to receive a fastener or coupling feature 152 formed on the mating component 150 to facilitate attachment of the two components. In some cases, the holes 104 are configured to form a mechanical joint with the coupling feature 152 that may be secured using an adhesive bonding agent, interference fit, snap fit, threaded connection, or other similar mechanical securing technique. In some embodiments, it may be advantageous that the holes 104 have a tight tolerance to facilitate a reliable and secure coupling between the ceramic component 110 and the mating component 150.

As shown in FIG. 1, the ceramic component 110 also includes a rib feature 106 located along a sidewall of the ceramic component 110. The rib feature 106 may define a raised protrusion or feature that projects from the sidewall and extends at least partially along at least part of the length of the ceramic component 110. While the rib feature 106 is formed as a protrusion in this example, in other embodiments, the rib feature 106 may be formed as a shelf or recess that extends at least partially along the length of the ceramic component 110.

The rib feature 106 may be configured to form an interlocking mechanical joint or interface with the mating component 150. The rib feature 106 may also form a support surface for positioning or locating the mating component 150. In some cases, it may be advantageous that the rib feature 106 have a thickness or width that is controlled within a tight tolerance in order to ensure proper fit with the mating component 150.

As shown in FIG. 1, the ceramic component 110 includes a pattern or array of holes 112 that are formed into a surface 114 of the ceramic component 110. The holes 112 may be formed completely through or may be partially through (e.g., blind) the sidewall of the ceramic component 110. In some cases, the holes 112 may form an acoustic or ventilation passage into an interior volume of the housing 100.

While the term "hole" is used to describe a generally cylindrical recess formed into the surface 114 of the ceramic component 110, the pattern of holes 112 may also represent a fine perforated region or protective grate. The perforated region may be configured to cover or protect an acoustic device, such as a speaker or microphone positioned within the housing of the device. The ceramic component 110 also includes holes 116 and 118 formed into a surface of the ceramic component 110. The holes 116 and 118 may be used to attach additional components, including, for example, one or more buttons, dials, or other similar components that are at least partially exposed to the exterior of the housing 100. As shown in FIG. 1, the hole 118 may not necessarily be round and may be rectangular or otherwise shaped to fit the mating part or assembly. The ceramic component 110 also includes opening 120, which may be configured to attach or interface with a separate component or subassembly.

The holes or openings 112, 116, 118, and 120 of the present example may vary in size and shape depending on the implementation. In some cases, the holes or openings 112, 116, 118, and 120 are formed within a specified tolerance to facilitate mechanical interface with other components and/or enhance the performance of the ceramic component 110.

In some implementations, the holes 112 may be less than 1.0 mm in diameter. In some cases, the holes 112 may be approximately 0.5 mm in diameter. The size of the holes may be configured to allow air or acoustic signals to pass while blocking debris or other foreign contaminants. It may be advantageous that the holes 112 have a high dimensional tolerance. For example, the holes 112 have a dimensional tolerance of +/−0.05 mm circularity or similar dimensional measurement.

In general, one or more features of the ceramic component 110 may be formed by machining the features into the ceramic component 110. In some cases, the particular application may require manufacturing tolerances that are difficult to achieve using traditional post sintering techniques. In particular, the size of the feature, the dimensional tolerance of the feature, and/or the precision of the placement of the feature may be difficult to achieve using traditional machining techniques. In particular, due to the hardness and toughness of many ceramic materials, traditional post-sintering machining techniques may result in excessive tool wear and/or tooling failures, increasing the cost and time to manufacture.

In some implementations, it may be advantageous to perform one or more machining operations before a ceramic component has been completely sintered. In some cases, the softer pre-sintered ceramic material may be machined at a faster rate with significantly less tool wear as compared to post-sintering techniques. In addition, finer and/or smaller features may be formed because more delicate tooling may be used on the softer material.

The example manufacturing processes described below with respect to FIGS. 2-4 may be used to machine one or more features in a ceramic component before sintering is complete. In particular, the manufacturing processes of FIGS. 2-4 can be used to form one or more of the features in the ceramic component 110 and/or the mating component 150 described above with respect to FIG. 1.

Figure 2:
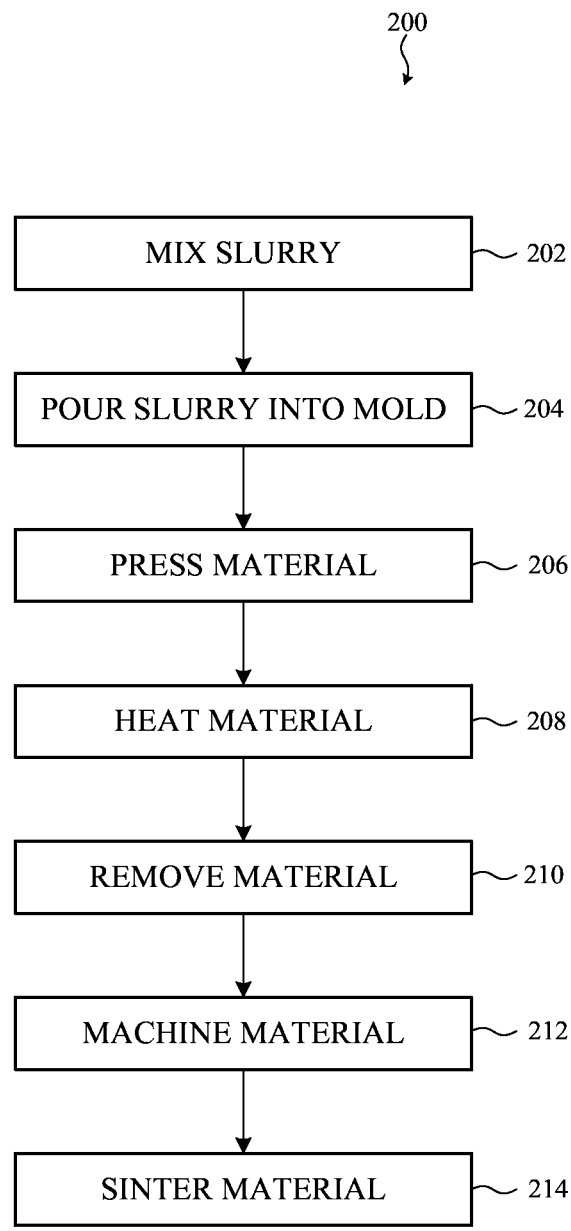
FIG. 2 is a flow chart depicting an example process for making a ceramic component by machining an unsintered material.

FIG. 2 depicts an example process 200 for machining a ceramic component before sintering is complete. In particular, process 200 is directed to an example casting process 200 in which the machining is performed before the ceramic component has been subjected to a significant sintering operation or process. For example, the ceramic component may be machined while the part is still a green body or bulk part.

With regard to the example operations of process 200, the ceramic part may be formed using a gel casting technique. While gel casting is provided as one specific example, other similar casting or part-forming operations may also be used. Generally, the gel casting method of process 200 may produce a part that is easier to machine, provides more precisely machined features, and nonetheless results in a strong, stable ceramic part.

In operation 202, solvent, water and/or ceramic powder material is mixed. In some embodiments the ceramic powder includes or comprises a zirconium dioxide powder. A zirconium dioxide powder may be particularly well suited for forming a strong and durable component for a housing of an electronic device, as described above with respect to FIG. 1. In some cases, the ceramic powder includes a mixture of zirconium dioxide and other ceramic components. In other embodiments, the primary ingredient of the ceramic powder includes one or more other types of ceramic materials including, for example, alumina, silica, lime, beryllium oxide, ferric oxide, and/or magnesia. The slurry may also include one or more binder components including, for example, a polymer, wax, bone ash, cellulous, and/or clays.

In operation 204 the slurry mixture is poured into a casting mold. The casting mold typically provides the overall shape and form of the ceramic component. The casting mold may include many of the final features of the ceramic component, but it may be difficult to form fine or delicate features using the mold due to limitations in the molding process.

In operation 206, the material in the mold is pressed. In many gel casting operations, the pressure applied to the material in the mold is maintained at a relatively low pressure. In some cases, the pressure is just high enough to force any air pockets or bubbles out of the slurry. By keeping the pressure low, the slurry is subjected to a lower amount of stress, which may reduce the chance that the material will warp or otherwise deform during the subsequent sintering process.

At operation 208, the material is heated to a temperature sufficient to oxidize the binder and evaporate or burn off the water and solvent. In some cases, the heating process does not perform any sintering or fusing of the ceramic powder. However, in some embodiments, the heating of operation 208 causes some of the ceramic powder to fuse and may perform some amount of sintering. For example, the heating operation 208 may result in partially sintering at least a portion of the green body. In some embodiments, the material is heated to a temperature that is less than 700 degrees Celsius. A partial or small amount of sintering may help stabilize the component once it is removed from the mold. Even though some amount of sintering may be performed, the component at this stage may still be referred to as a green body.

At operation 210, the material is removed from the mold. In some implementations, the mold may be configured to split into two halves (e.g., a cope half and a drag half). After the heating operation 208 and the part is allowed to cool, the mold may be split or open and the material removed. In some cases, the mold is a single-use mold and may be cracked or destroyed as part of operation 210.

In operation 212, the material may be machined. In the present example, the material is in a substantially unsintered or green body state. As described above, while the material may have undergone a small amount of sintering in operation 208, the material may still be considered to be a green body. As previously mentioned, by machining the material in the green state, the wear on the tooling may be reduced and finer or more delicate tooling may be used. Additionally, the speed or rate of cutting may be drastically improved, which may have a dramatic impact on the manufacturing time and cost.

Example machining operations include cutting, milling, drilling, grinding, and other techniques for mechanically removing material from the surface or surfaces of the component. With respect to FIG. 1, operation 212 may be used to form at least part of the mounting features 102 and/or the rib feature 106. For example, operation 212 may be used to mill or grind the top surface of either or both of the mounting features 102 and/or the rib feature 106. Thus, the overall height of those features may be controlled to a tighter tolerance than typically produced using an as-cast feature. In some cases, the machined features may have a tolerance of +/−0.05 mm or less. In some cases, the tolerance may be +/−0.03 mm or less. Additionally, the surface finish may be smoother, which may facilitate attachment and/or sealing with the mating component 150.

Operation 212 may also be particularly well-suited for machining holes in the ceramic component. In particular, operation 212 may be used to machine holes that are smaller than can typically be created on or through a hardened, fully-sintered component. In some examples, holes having a diameter of less than 1 mm may be drilled while the material is a green body. In some cases, holes as small as 0.5 mm or less may be machined into the unsintered or green body material. The formation of fine or small holes may be particularly useful for forming the perforated pattern of holes 112 described above with respect to the ceramic component 110 of FIG. 1.

In some cases, machining holes using operation 212, as described herein, may allow the formation of smaller holes and cycle times that are significantly improved as compared to processes that perform machining operations after sintering is complete. By way of example, if the holes 112 were to be formed after a full sintering operation, the hardness of the material (e.g., 1000 HV on the Vickers Hardness scale) may limit the minimum diameter to 1 mm or greater. The hardness of a fully sintered part may also result in a cycle time to drill a single hole that is five minutes or longer. In comparison, by machining the holes 112 in the relatively soft green body, having a hardness ranging between 10 HV and 100 HV, the hole diameter may be as small as 0.5 mm or less. The cycle time may also be significantly reduced and, in some cases, the cycle time per 1 mm diameter hole at a depth of 2 mm may be five seconds or less.

Similarly, operation 212 may be used to form any one of a variety of other features in the green body. With respect to FIG. 1, operation 212 may be used to form one or more of the holes or openings 120, 118, and 116 of the ceramic component 110. Additionally or alternatively, operation 212 may be used to form a smooth surface along the exterior of the ceramic component 110 to provide either a desired tactile feel or an optically smooth shiny surface. Similarly, one or more features of the mating component 150 may be formed in operation 212, provided that the mating component 150 is formed from a ceramic component using a process similar to the current process 200.

In operation 214, the material is heated to a high temperature to sinter the ceramic particles together. In some embodiments, the material is sintered at temperatures of up to 1500 degrees Celsius for up to 24 hours to form a hardened block of ceramic material. In some cases, a full sintering process includes heating the material to a temperature ranging between 1400 and 1600 degrees Celsius for a duration of between 12 and 24 hours. During the sintering process, the ceramic powder and/or ceramic particles in the green body are fused together to form a substantially solid and structurally rigid component. In the sintering process, the material may shrink up to 40% from its original dimensions. The machining operations of operation 212 may be configured to account for a predicted shrinkage to provide final dimensions that are within the desired dimensional tolerance. In some cases, some amount of final machining, such as reaming, polishing, or buffing is performed after sintering to achieve the final dimensional tolerance and/or surface finish.

Figure 3:
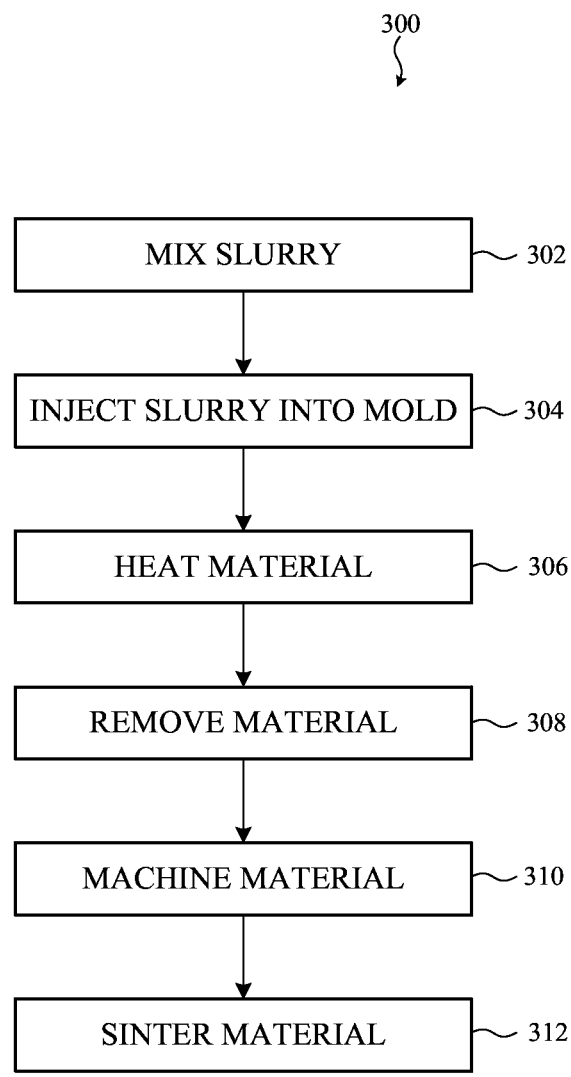
FIG. 3 is a flow chart depicting an alternative example process for making a ceramic component by machining an unsintered material.

FIG. 3 depicts an example process 300 for machining a ceramic component before sintering is complete. In particular, process 300 is directed to an example molding process 300 in which the machining is performed before the ceramic component has been subjected to a significant sintering operation or process. For example, the ceramic component may be machined while the part is still a green body or bulk part.

With regard to the example operations of process 300, the ceramic part may be formed using an injection-molding technique. While injection molding is provided as one specific example, other similar molding or part-forming operations may also be used.

In operation 302, solvent, water and/or ceramic powder material is mixed. Operation 302 may be substantially similar to operation 202 of process 200 described above with respect to FIG. 2. Because process 300 is directed to a molding-based rather than a casting-based process, the specific formulation of the slurry may differ between the processes. In particular, the amount of liquid may vary to produce a more viscous or less viscous slurry. Additionally, the types of binders or other additives that are used may be specially configured or formulated for an injection molding rather than a gel casting process In operation 304, the slurry is injected into a mold. In some implementations, the slurry, also referred to as a feedstock, may be injected into a mold cavity formed between two halves (e.g., a core half and a cavity half) of an injection mold, which are subjected to a significant clamping force that may be 50 tons or greater. In some cases, the pressure used to inject the slurry or feedstock is provided by a hydraulic piston, feed screw, or other similar mechanism. The pressure applied to the slurry in operation 304 may be much greater as compared to the pressing operation 206 of process 200 discussed above with respect to FIG. 2. This may force the slurry to fill smaller or more complex features formed into the mold, which may facilitate the formation of a more refined part. However, the high pressure of the injection-molding process may form some residual stresses in the material.

At operation 306, the material is heated. In operation 306, the material may be heated to a temperature sufficient to oxidize the binder and evaporate or burn off the water and solvent. Operation 306 may be substantially similar to operation 208 of process 200 discussed above with respect to FIG. 2. In some cases, the heating of operation 306 may be performed at a higher temperature and/or a longer duration in order to help reduce some of the residual stresses induced during the injection operation 304. In some implementations, this may result in a larger percentage of ceramic powder or particles that are sintered or fused during operation 306. However, for purposes of this example, the heated material may be considered a green body even though it may have been partially sintered as a result of the heating of operation 306.

In operation 308, the material may be removed from the mold. In some cases, the material is allowed to cool slightly before the two halves of the injection mold are unclamped and separated. The injection mold may include knock-out pins or other features that assist in removing the material from the mold.

In operation 310, the material is processed by machining. Operation 310 may be substantially similar to operation 212 described above with respect to process 200. In particular, various features may be machined into the ceramic component while it is substantially unsintered, which may improve manufacturing cycle time and facilitate the use of smaller more delicate tools as compared to traditional post-sintering machining operations.

In operation 312, the material is fully sintered. Operation 312 may be substantially similar to operation 214 described above with respect to process 200. In particular, the molded and machined component may be fully sintered to form the final component. In some cases, further light machining operations are performed on the sintered component including, for example, reaming, polishing, and surface finishing machining operations.

Figure 4:
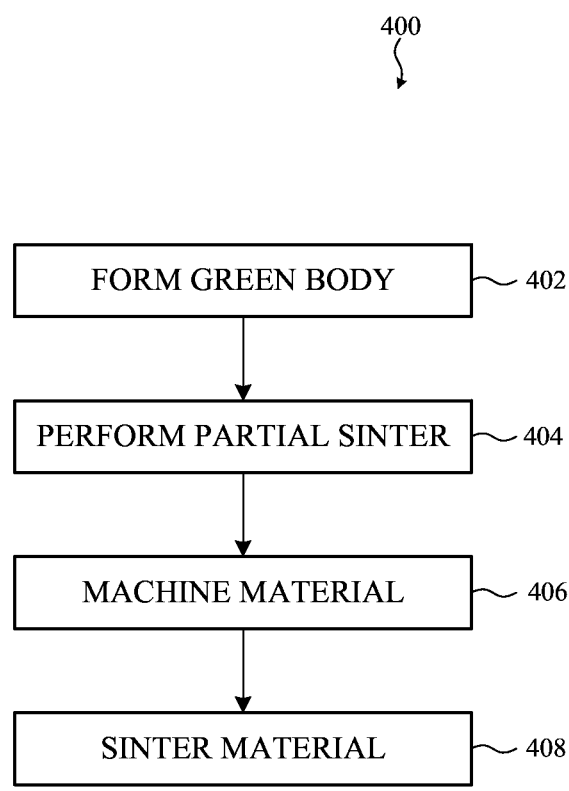
FIG. 4 is a flow chart depicting an example process for making a ceramic component by machining a partially sintered component.

FIG. 4 depicts a flow chart depicting an example process 400 for making a ceramic component by machining a partially sintered component. Process 400 may be a variant of either process 200 or process 300 described above with the added distinction that one or more features may be machined after the green body has been at least partially sintered. One advantage to the process 400 is that the partially sintered component may have an increased dimensional and structural stability, which may facilitate the machining of higher precision or higher tolerance features. In addition, the amount of shrinkage between machining and full sintering operations may be reduced, which may increase the predictability of the shrinkage, which may further improve the dimensional tolerances that can be maintained on the final component.

In operation 402, a green body is formed having the desired bulk shape. Operation 402 may be performed in accordance with either process 200 or 300 described above with respect to FIGS. 2 and 3. In particular, operation 402 may correspond to operations 202, 204, 206, 208, and 210 of the casting process 200. Operation 402 may also correspond to operations 302, 304, 306, and 308 of injection-molding process 300.

In operation 404, a partial sintering process is performed on the green body. In some implementations, the material is heated to a temperature that is greater than the temperatures of the heating operations 208 and 306 of processes 200 and 300, respectively. However, in some embodiments, operation 404 is performed at the same time or consecutively with the heating operations 208 and 306. In some embodiments, the material is heated to a temperature that is greater or equal to 700 degrees Celsius and less than or equal to 1200 degrees Celsius. In some cases, the partial sintering operation is performed at a temperature of approximately 900 degrees Celsius. The material may be subjected to the elevated temperature for a duration between one and five hours.

Operation 404 may result in a material having an improved structural and dimensional stability as compared to a green body ceramic. In some cases, this may improve the ability to handle the component and perform the machining operations of operation 406 discussed below. However, the partial sintering may also increase the hardness of the material from approximately 10 HV for a completely unsintered green body to approximately 100 HV for a partially sintered component. While the hardness has increased as compared to a green body, the partially sintered component will typically have a significantly reduced hardness as compared to a fully sintered component, which may have a hardness of 1000 HV or greater.

In operation 406, the material is machined. Operation 406 may be substantially similar to operation 212 described above with respect to process 200. While operation 406 may still provide many of the same advantages as described above with respect to the green body machining operation of 212, the increased hardness of the material may have various effects. In particular, the increased hardness may improve the ability to handle (e.g., clamp and fixture) the component, which may improve the manufacturability or machinability of the component. In some cases, a partially sintered component may have a reduced risk of chipping or cracking as compared to a green body. The partial sintering may also increase the dimensional stability and overall shrinkage between machining and final sintering, which may result in more predicable dimensions and higher tolerance features. However, due to the increased hardness, the overall cycle time to machine features may be increased. By way of example, the cycle time to drill a 1 mm hole may increase from five seconds for a green body machining operation to around 30 seconds for a partially sintered machining operation. This is still a significant improvement over the a fully sintered machining operation, which may take five minutes or more. Additionally, machining a partially sintered component, it may still be possible to drill holes having diameters below 1.0 mm, including holes of 0.5 mm or less.

In operation 408 the material is fully sintered. Operation 408 may be substantially similar to operation 214 described above with respect to process 200. In particular, the molded and machined component may be fully sintered to form the final component. In some cases, further light machining operations are performed on the sintered component including, for example, reaming, polishing, and surface finishing machining operations.

Figure 5:
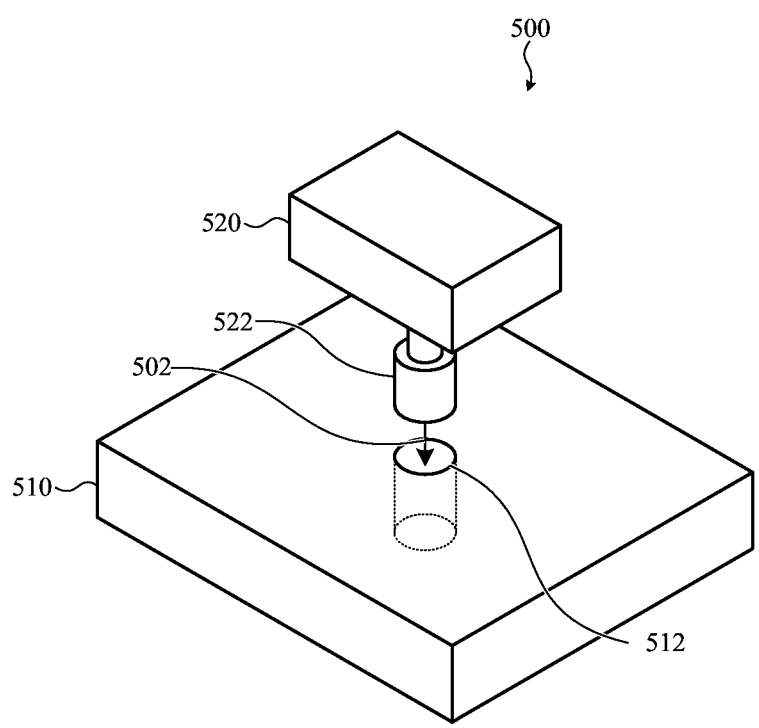
FIG. 5 depicts an example system for machining a ceramic component before being fully sintered.

FIG. 5 depicts an example system 500 for machining a ceramic component or ceramic material 510 before being fully sintered. The system 500 of FIG. 5 may be used to perform one or more of the machining operations described above with respect to FIGS. 2-4. The ceramic material 510 depicted in FIG. 5 may be a green body ceramic formed in accordance with processes 200 and 300 or, alternatively, may be a partially sintered ceramic formed in accordance with process 400.

As shown in FIG. 5, ceramic material 510 may be drilled with a drill bit 522 operatively coupled to a CNC machine 520 in a downward direction 502. Because ceramic material 510 has not been fully sintered, the cycle time for drilling the hole 512 may be significantly improved as compared to a machining operation performed on a fully sintered component. For example, if the ceramic material 510 is a green body having a hardness of about 10 HV, the drilling time for a hole having a diameter of approximately 1 mm and a depth of about 2 mm may be roughly five seconds. If the ceramic material 510 is a partially sintered component having a hardness of about 100 HV, the drilling time for a hole having a diameter of approximately 1 mm and a depth of about 2 mm may be roughly 30 seconds. It should be appreciated that the drilling time may vary between embodiments.

Further, tool life may be increased when drilling a green body material as opposed to a sintered material. In one embodiment, the drill bit 522 may machine about 100 holes before replacement (as opposed to a single hole before replacement when drilling a fully-sintered ceramic).

Additionally, worn bits may create uneven holes, which in turn may result in uneven shrinkage of the ceramic material 510 when it is fully sintered. This uneven shrinkage, in turn, may vary the density of the ceramic material 510 in the region of the hole 512 or may result in the formation of cracks near the hole 512. Accordingly, machining a green body or partially sintered component instead of a fully sintered component may ultimately result in fewer defects in an end product.

It should be appreciated that the degree of skill required for machining green body and/or partially-sintered ceramic materials may be greater than that required to machine a fully-sintered product, in order to prevent green body and/or partially-sintered materials from cracking or chipping due to their softer material characteristics. However, the improved processing characteristics of the embodiments disclosed with respect to FIGS. 2-4 typically result in greater production runs for ceramic parts, thus reducing overall manufacturing cost and the resultant price of parts while maintaining desired functionality and aesthetic appearance.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:
1. A method for manufacturing a ceramic component for a portable electronic device, comprising:
  forming a green body from a ceramic powder comprising zirconium dioxide by heating the ceramic powder to a temperature that is below 700° C.;
  partially sintering the green body at a temperature between 700 and 1200° C. to form a partially sintered body having a hardness of less than 1000 HV on a Vickers Hardness scale;

machining the partially sintered body to define a hole in a surface of the partially sintered body; and sintering the partially sintered body to form the ceramic component, wherein the hole defined by the ceramic component has a diameter of 1 mm or less and a dimensional tolerance of +/−0.05 mm or less.

2. The method of claim 1, further comprising:

mixing a slurry including a solvent, water, and the ceramic powder;

pouring the slurry into a casting mold;

applying pressure to the slurry while in the casting mold;

heating the slurry while in the casting mold to form the green body; and removing the green body from the casting mold.

3. The method of claim 2, wherein heating the slurry includes heating at a temperature sufficient to burn off or evaporate the water and solvent of the slurry.

4. The method of claim 2, wherein heating the slurry results in the green body having a hardness of less than 100 HV on a Vickers Hardness scale.

5. The method of claim 1, wherein forming the green body is performed using a ceramic casting process.

6. The method of claim 1, wherein forming the green body is performed using an injection-molding process.

7. The method of claim 1, wherein:

machining the green body includes drilling the hole into the surface of the green body; and the hole has a diameter of less than 1 mm.

8. The method of claim 1, wherein partially sintering the green body results in the partially sintered body having a hardness of approximately 100 HV on a Vickers Hardness scale.

9. The method of claim 1, wherein partially sintering the green body includes heating the green body to a temperature of approximately 900 degrees Celsius for a duration ranging between one and five hours.

10. The method of claim 1, wherein fully sintering the partially sintered body includes heating the partially sintered body to a temperature of approximately 1500 degrees Celsius for a duration between 12 and 24 hours.

11. The method of claim 1, further comprising inserting at least a portion of a mating component into the hole to couple the mating component to the ceramic component.

* * * * *